(12) United States Patent
Shimotsusa (10) Patent No.: US 8,274,122 B2
(45) Date of Patent: Sep. 25, 2012

(54) PHOTOELECTRIC CONVERSION DEVICE, IMAGING SYSTEM, PHOTOELECTRIC CONVERSION DEVICE DESIGNING METHOD, AND PHOTOELECTRIC CONVERSION DEVICE MANUFACTURING METHOD

(75) Inventor: Mineo Shimotsusa, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 653 days.

(21) Appl. No.: 12/416,994

(22) Filed: Apr. 2, 2009

(65) Prior Publication Data
US 2009/0250778 A1 Oct. 8, 2009

(30) Foreign Application Priority Data
Apr. 4, 2008 (JP) .................................. 2008-098748

(51) Int. Cl.
*H01L 21/00* (2006.01)
(52) U.S. Cl. ..................... 257/432; 257/292; 257/437
(58) Field of Classification Search .................. 257/432, 257/292, 437
See application file for complete search history.

(56) References Cited

U.S. PATENT DOCUMENTS

| | | | |
|---|---|---|---|
| 6,060,732 A * | 5/2000 | Murakami et al. ............. | 257/215 |
| 6,166,405 A | 12/2000 | Kuriyama et al. ............. | 257/290 |
| 6,468,826 B1 * | 10/2002 | Murakami et al. .............. | 438/48 |
| 7,126,102 B2 | 10/2006 | Inoue et al. .................... | 250/214 |
| 7,393,715 B2 * | 7/2008 | Tazoe et al. ...................... | 438/57 |
| 7,411,170 B2 * | 8/2008 | Shimotsusa et al. ........ | 250/208.1 |
| 7,411,173 B2 | 8/2008 | Park ........................... | 250/214.1 |
| 7,592,578 B2 * | 9/2009 | Shimotsusa et al. ........ | 250/208.1 |
| 7,884,434 B2 * | 2/2011 | Hashimoto ................... | 257/432 |
| 7,935,557 B2 * | 5/2011 | Mishima et al. ............... | 438/60 |
| 8,013,409 B2 * | 9/2011 | Itahashi ........................ | 257/432 |
| 8,049,153 B2 * | 11/2011 | Tay et al. ..................... | 250/208.1 |
| 8,084,287 B2 * | 12/2011 | Hashimoto ..................... | 438/66 |
| 2004/0188597 A1 | 9/2004 | Inoue et al. ................ | 250/214 R |
| 2005/0110002 A1 | 5/2005 | Noda .............................. | 257/21 |
| 2006/0151818 A1 * | 7/2006 | Toumiya ....................... | 257/294 |
| 2006/0172450 A1 * | 8/2006 | Tazoe et al. ..................... | 438/57 |
| 2007/0155043 A1 * | 7/2007 | Hashimoto ..................... | 438/69 |
| 2008/0054165 A1 * | 3/2008 | Shimotsusa et al. ...... | 250/214 R |
| 2008/0079106 A1 | 4/2008 | Miyagawa et al. ........... | 257/437 |

(Continued)

FOREIGN PATENT DOCUMENTS

EP 1 884 997 A1 2/2008

(Continued)

OTHER PUBLICATIONS

H. Kubota, "Applied Optics" Iwanami, Tokyo, 1959, pp. 92-97 (in Japanese with partial English translation).

*Primary Examiner* — Laura Menz
(74) *Attorney, Agent, or Firm* — Fitzpatrick, Cella, Harper & Scinto (57) ABSTRACT

A photoelectric conversion device comprises a plurality of photoelectric conversion units, a first antireflection portion including a first insulation film which has a first refractive index and a second insulation film which has a second refractive index, and a second antireflection portion including an element isolation portion which includes an insulator having a third refractive index and a third insulation film which has the second refractive index, wherein the first antireflection portion reduces reflection of light entering the photoelectric conversion unit in the photoelectric conversion unit, and the second antireflection portion reduces reflection of light entering the element isolation portion in the element isolation portion.

12 Claims, 7 Drawing Sheets

U.S. PATENT DOCUMENTS

| | | | |
|---|---|---|---|
| 2009/0011532 A1* | 1/2009 | Shimotsusa et al. | 438/59 |
| 2009/0136174 A1* | 5/2009 | Itahashi | 385/14 |
| 2009/0166518 A1* | 7/2009 | Tay et al. | 250/227.11 |
| 2009/0250778 A1* | 10/2009 | Shimotsusa | 257/432 |
| 2010/0155870 A1* | 6/2010 | Tay et al. | 257/432 |
| 2010/0173444 A1* | 7/2010 | Mishima et al. | 438/60 |
| 2010/0214432 A1* | 8/2010 | Nakata et al. | 348/222.1 |
| 2010/0265384 A1* | 10/2010 | Tay et al. | 348/336 |
| 2010/0283112 A1* | 11/2010 | Tay | 257/432 |
| 2011/0027936 A1* | 2/2011 | Tay et al. | 438/70 |
| 2011/0031381 A1* | 2/2011 | Tay et al. | 250/226 |
| 2011/0057279 A1* | 3/2011 | Lee et al. | 257/432 |
| 2011/0108705 A1* | 5/2011 | Izuha et al. | 250/208.1 |
| 2011/0171770 A1* | 7/2011 | Mishima et al. | 438/60 |
| 2011/0234868 A1* | 9/2011 | Yamashita et al. | 348/294 |
| 2011/0242350 A1* | 10/2011 | Sawayama | 348/222.1 |
| 2011/0242388 A1* | 10/2011 | Watanabe et al. | 348/308 |
| 2011/0249163 A1* | 10/2011 | Ikeda et al. | 348/308 |
| 2011/0281391 A1* | 11/2011 | Itahashi | 438/69 |

FOREIGN PATENT DOCUMENTS

| | | | |
|---|---|---|---|
| EP | 1884997 A1 * | 2/2008 | |
| EP | 2107608 A2 * | 10/2009 | |
| JP | 11-040790 A | 2/1999 | |
| JP | 2000-012822 A | 1/2000 | |
| JP | 2000-196051 A | 7/2000 | |
| JP | 2004-235609 A | 8/2004 | |
| JP | 2008060356 A * | 3/2008 | |
| JP | 2009252984 A * | 10/2009 | |
| JP | 2010161236 A * | 7/2010 | |
| JP | 2010161236 A1 * | 7/2010 | |
| JP | 2010206173 A * | 9/2010 | |
| JP | 2010206181 A * | 9/2010 | |
| KR | 10-0752646 B1 | 4/2007 | |
| WO | WO 2010090104 A1 * | 8/2010 | |
| WO | WO 2010090105 A1 * | 8/2010 | |
| WO | WO 2010090148 A1 * | 8/2010 | |

* cited by examiner

PHOTOELECTRIC CONVERSION DEVICE, IMAGING SYSTEM, PHOTOELECTRIC CONVERSION DEVICE DESIGNING METHOD, AND PHOTOELECTRIC CONVERSION DEVICE MANUFACTURING METHOD

BACKGROUND OF THE INVENTION

1. Field of the Invention

The present invention relates to a photoelectric conversion device, imaging system, designing method, and photoelectric conversion device manufacturing method.

2. Description of the Related Art

Photoelectric conversion devices such as a CMOS sensor are recently employed in 2D image input apparatuses such as a digital still camera and digital video camera, and 1D image reading apparatuses such as a facsimile apparatus and scanner. In the photoelectric conversion device, an object image is formed on a plurality of photodiodes arrayed two- or one-dimensionally. The photodiodes generate charges corresponding to light for generating an image signal. The photoelectric conversion device needs to increase the sensitivity of photodiodes.

According to a technique disclosed in Japanese Patent Laid-Open No. 2000-012822, an antireflection film is formed on each photodiode to decrease the quantity of light reflected by the surface of each photodiode. According to Japanese Patent Laid-Open No. 2000-012822, a plurality of photodiodes can efficiently generate charges corresponding to light, increasing the sensitivity of the photodiodes.

These days, photoelectric conversion devices require a larger number of pixels in a predetermined chip area. It is necessary to reduce an area occupied by the unit pixel. In some cases, photoelectric conversion devices need to be made compact. The chip area for forming a predetermined number of pixels is reduced by reducing the area occupied by the unit pixel.

When STI (Shallow Trench Isolation) element isolation portions are formed in a semiconductor substrate, the interval between a plurality of photodiodes can be decreased. With this arrangement, the area occupied by the unit pixel can be reduced, easily increasing the number of pixels in a predetermined chip area. Since the area occupied by the unit pixel can be reduced without reducing the area of photodiodes, the chip area for forming a predetermined number of pixels can be reduced.

As the area occupied by the unit pixel decreases, the size of the photodiode (photoelectric conversion unit) and that of the element isolation portion need to be further decreased. The size of the element isolation portion is restricted by a power supply voltage used in the photoelectric conversion device. It is more difficult to decrease the size of the element isolation portion than to decrease that of the photodiode. When decreasing the area occupied by the unit pixel, the shrinkage factor of the size of the photodiode sometimes becomes higher than that of the size of the element isolation portion. As the area occupied by the unit pixel decreases, the absolute area of the photodiode decreases, and a relative area occupied by the photodiode in the unit pixel may also decrease.

The present inventor has found the following problems. As the area occupied by the unit pixel decreases, the (absolute and relative) area of the photodiode decreases, and the interval between adjacent photodiodes sometimes decreases. In this case, the interval between lines arranged between photodiodes and color filters may also decrease. If the interval between lines decreases, light passing through it diffracts, increasing the ratio of light entering not the photodiode but the element isolation portion. Most of the light entering the element isolation portion is often reflected by the upper face of the element isolation portion. Alternatively, the light enters inside from the upper face of the element isolation portion, is reflected by the side or bottom face, and exits upward from the upper face of the element isolation portion. Not only does the area of the photodiode decrease, but also the ratio of light entering the photodiode decreases. As a result, the sensitivity of the photodiode may greatly decrease.

SUMMARY OF THE INVENTION

It is an aim of the present invention to photoelectrically convert light entering an element isolation portion to generate charges and use them as a signal.

According to the first aspect of the present invention, there is provided a photoelectric conversion device comprising: a plurality of photoelectric conversion units which are arranged in a semiconductor substrate; a first antireflection portion including a first insulation film which is arranged on the photoelectric conversion units and which has a first refractive index, and a second insulation film which is arranged on the first insulation film and which has a second refractive index; and a second antireflection portion including an element isolation portion which is arranged on the semiconductor substrate and which electrically isolates the plurality of photoelectric conversion units and which includes an insulator having a third refractive index, and a third insulation film which is thicker than the second insulation film and which is arranged on the element isolation portion and which has the second refractive index, wherein the first antireflection portion reduces reflection of light entering the photoelectric conversion unit in the photoelectric conversion unit, and the second antireflection portion reduces reflection of light entering the element isolation portion in the element isolation portion.

According to the second aspect of the present invention, there is provided a photoelectric conversion device comprising: a plurality of photoelectric conversion units which are arranged on a semiconductor substrate; a first insulation film which is arranged on the photoelectric conversion units and which has a first refractive index; a second insulation film which is arranged on the first insulation film and which has a second refractive index; an element isolation portion which is arranged on the semiconductor substrate and which electrically isolates the plurality of photoelectric conversion units and which includes an insulator having a third refractive index; and a third insulation film which is thicker than the second insulation film and which is arranged on the element isolation portion and which has the second refractive index, wherein the second refractive index is higher than the first refractive index and higher than the third refractive index.

According to the third aspect of the present invention, there is provided an imaging system comprising: a photoelectric conversion device according to the first aspect of the present invention; an optical system which forms an image on an image sensing surface of the photoelectric conversion device; and a signal processing unit which processes a signal output from the photoelectric conversion device to generate image data.

According to the fourth aspect of the present invention, there is provided an imaging system comprising: a photoelectric conversion device according to the second aspect of the present invention; an optical system which forms an image on an image sensing surface of the photoelectric conversion device; and a signal processing unit which processes a signal output from the photoelectric conversion device to generate image data.

According to the fifth aspect of the present invention, there is provided a method of designing a photoelectric conversion device including a plurality of photoelectric conversion units which are arranged in a semiconductor substrate, a first antireflection portion including a first insulation film which is arranged on the photoelectric conversion units and which has a first refractive index, and including a second insulation film which is arranged on the first insulation film and which has a second refractive index, and a second antireflection portion including an element isolation portion which is arranged on the semiconductor substrate and which electrically isolates the plurality of photoelectric conversion units and which includes an insulator having a third refractive index, and including a third insulation film which is arranged on the element isolation portion and which has the second refractive index, the method comprises: a first step of obtaining a reflectance in the element isolation portion when the third insulation film is formed on the element isolation portion at the same thickness as a thickness of the second insulation film; and a second step of obtaining a thickness of the third insulation film so as to set a reflectance in the element isolation portion lower than the reflectance obtained in the first step.

According to the sixth aspect of the present invention, there is provided a method of manufacturing a photoelectric conversion device having a semiconductor substrate in which a plurality of photoelectric conversion units for generating charges corresponding to light are arranged, the method comprises: a first step of forming, on the semiconductor substrate, an element isolation portion which electrically isolates the plurality of photoelectric conversion units and includes an insulator having a first refractive index; a second step of forming a first insulation film having a second refractive index on the plurality of photoelectric conversion units; a third step of forming a second insulation film having a third refractive index on the first insulation film; and a fourth step of forming a third insulation film on the element isolation portion at a thickness determined to set a reflectance in the element isolation portion lower than a reflectance obtained when a third insulation film having the third refractive index is formed on the element isolation portion at the same thickness as a thickness of the second insulation film.

The present invention can photoelectrically convert light entering an element isolation portion to generate charges and use them as a signal.

Further features of the present invention will become apparent from the following description of exemplary embodiments with reference to the attached drawings.

DESCRIPTION OF THE EMBODIMENT

The present invention is directed to a photoelectric conversion device used in a digital still camera, digital video camera, and the like, and a manufacturing method thereof. In the following description, "reducing reflection" of a given target means reducing the reflectance of the target by adjusting multiple reflection conditions.

Figure 1:
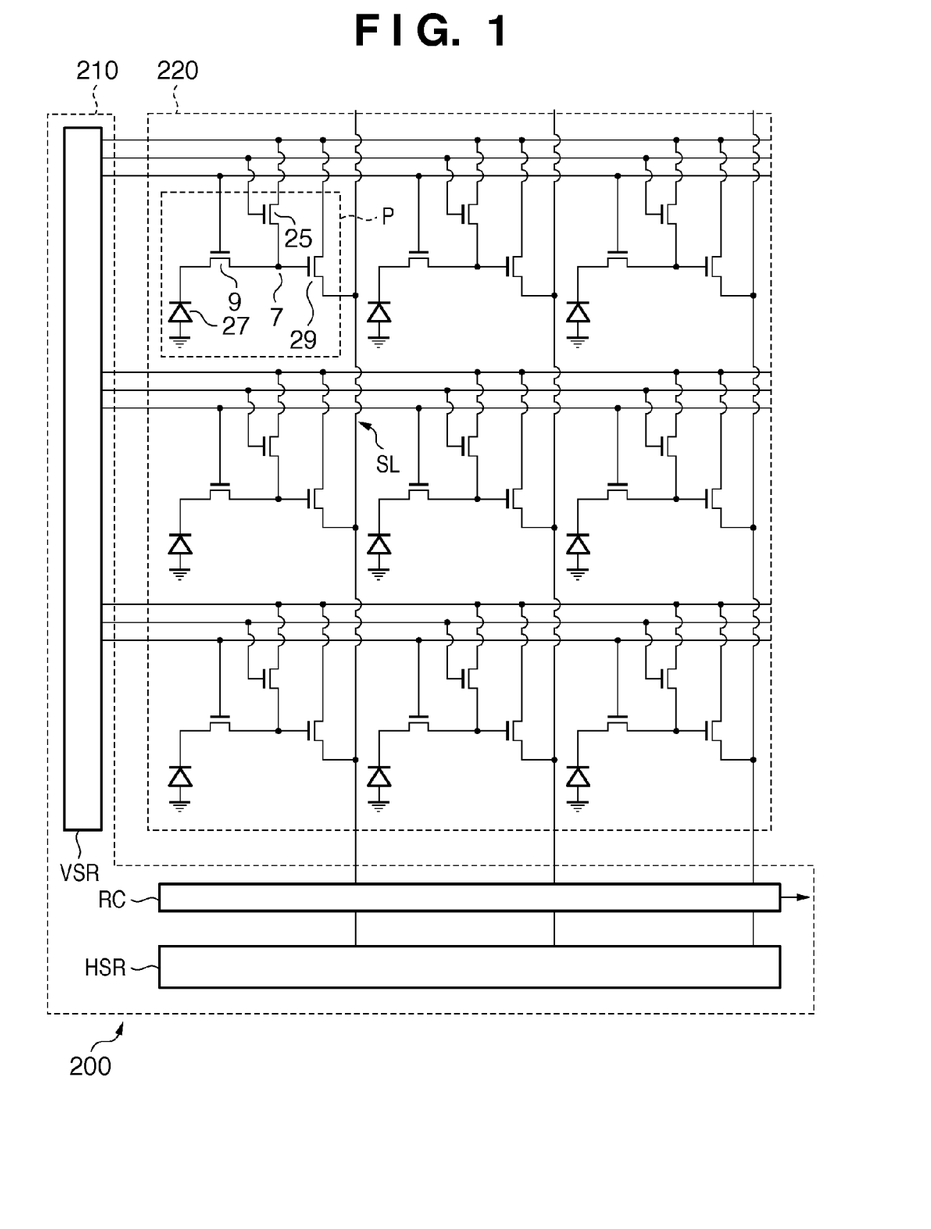
FIG. 1 is a circuit diagram showing the circuit arrangement of a photoelectric conversion device according to an embodiment of the present invention.
Figure 2:
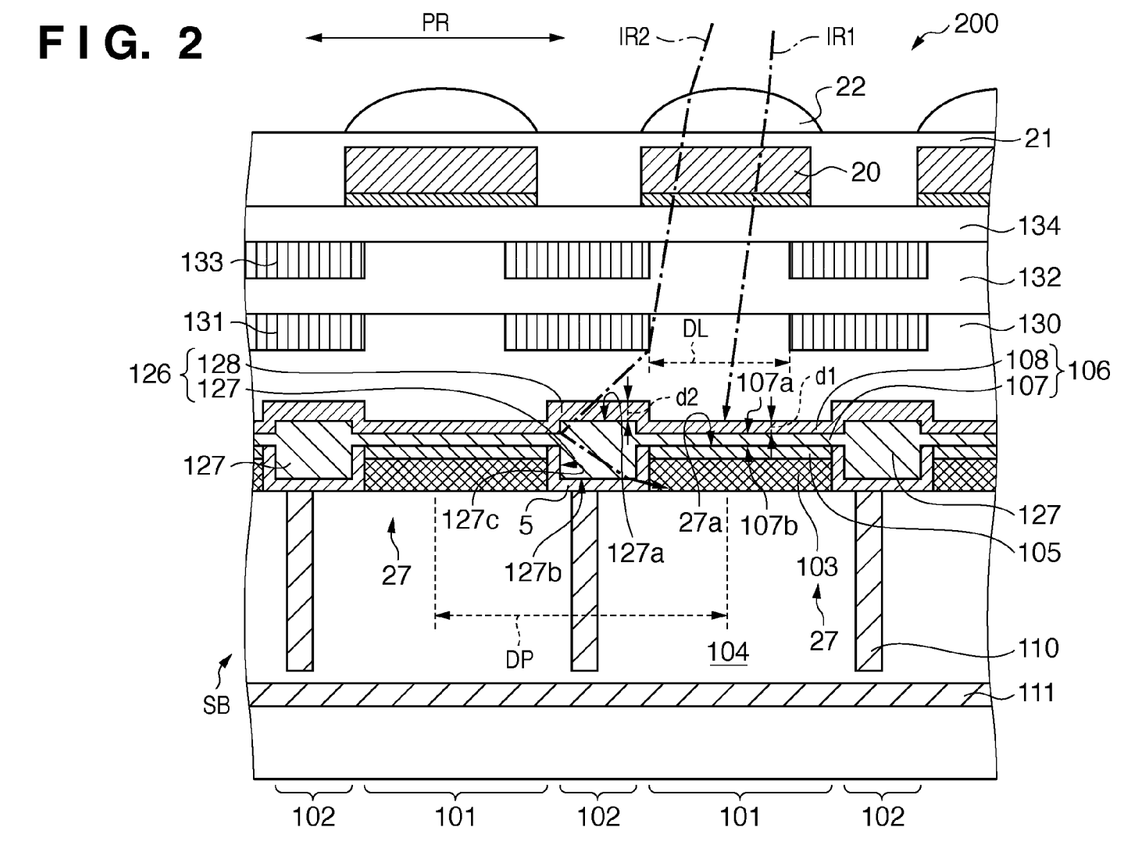
FIG. 2 is a sectional view showing the sectional structure of the photoelectric conversion device according to the embodiment of the present invention.
Figure 3:
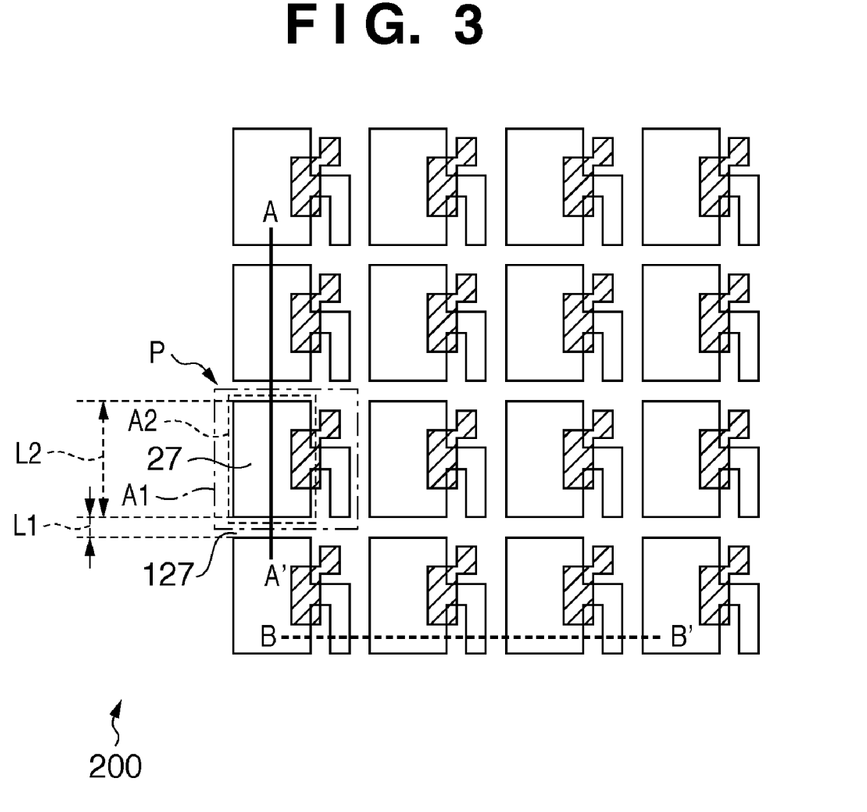
FIG. 3 is a plan view showing the array of pixels.

The schematic arrangement of a photoelectric conversion device 200 according to an embodiment of the present invention will be explained with reference to FIGS. 1 to 3. FIG. 1 is a circuit diagram showing the circuit arrangement of the photoelectric conversion device 200 according to the embodiment of the present invention. FIG. 2 is a sectional view showing the sectional structure of the photoelectric conversion unit of the photoelectric conversion device 200 according to the embodiment of the present invention. FIG. 3 is a plan view showing the array of pixels P. FIG. 2 shows a section taken along the line A-A' in FIG. 3.

The photoelectric conversion device 200 has a pixel array region 220 and peripheral region 210.

The peripheral region 210 is positioned around the pixel array region 220. A control circuit and the like are arranged in the peripheral region 210. The control circuit includes a circuit for controlling a plurality of pixels P, and a circuit for outputting signals from the pixels P. The control circuit includes, for example, a vertical scanning circuit VSR for scanning the rows of the pixels P, a readout circuit RC for reading out signals from pixels P on respective columns, and a horizontal scanning circuit HSR for scanning the columns of the readout circuit. The readout circuit includes, for example, a circuit for amplifying a signal from the pixel P, and an output line and switch for outputting a readout signal to a subsequent stage. In the peripheral region 210, the control circuit includes transistors each of which includes a source or drain region arranged in a semiconductor substrate SB (see FIG. 2) and a gate electrode arranged on the semiconductor substrate SB.

In the pixel array region 220, a plurality of pixels P are arrayed two-dimensionally (in the row and column directions) (see FIGS. 1 and 3). The semiconductor substrate SB, lines 131 and 133, interlayer films 130, 132, and 134, a color filter 20, a first antireflection portion 106, a second antireflection portion 126, a semiconductor region 5, a planarized layer 21, and a microlens 22 are arranged in a region PR (see FIG. 2) corresponding to one pixel P.

As shown in FIG. 1, each pixel P includes a reset transistor 25, photoelectric conversion unit 27, transfer gate 9, floating diffusion (to be referred to as an FD hereinafter) 7, and amplification transistor 29. The reset transistor 25 includes a source or drain region arranged in the semiconductor substrate SB and a gate electrode arranged on the semiconductor substrate SB. The reset transistor 25 resets the FD 7. The photoelectric conversion unit 27 is arranged in the semiconductor substrate SB in a light receiving region 101 (see FIG. 2). The photoelectric conversion unit 27 generates charges corresponding to incident light (e.g., incident light IR1) by photoelectric conversion, and accumulates them. The photoelectric conversion unit 27 is, e.g., a photodiode, and includes a charge accumulation region 103 and protection layer 105. The charge accumulation region 103 accumulates charges generated by photoelectric conversion. The protection layer 105 is formed to prevent exposure of the charge accumulation region 103 from the surface to protect the charge accumulation region 103.

The transfer gate 9 is arranged on the semiconductor substrate SB. The transfer gate 9 transfers charges accumulated in the photoelectric conversion unit 27 to the FD 7. The FD 7 is arranged in the semiconductor substrate SB. The FD 7 converts charges into a voltage (signal). The amplification transistor 29 includes a source or drain region arranged in the semiconductor substrate SB and a gate electrode arranged on the semiconductor substrate SB. The amplification transistor 29 performs a source follower operation together with a current source load (not shown) connected to a column signal line SL, thereby amplifying a signal input from the FD 7, and outputting the amplified signal to the column signal line SL. In this way, a signal is read out from the pixel P.

Each element isolation portion 127 includes an insulator, and the insulator is formed of, e.g., silicon oxide. The element isolation portions 127 are arranged in the semiconductor substrate SB in element isolation regions 102. The element isolation portions 127 electrically isolate a plurality of elements 25, 27, 7, 9, 29, and the like, included in each pixel P, and electrically isolate pixels from each other. For example, the element isolation portions 127 electrically isolate a plurality of photoelectric conversion units 27. A region defined by the element isolation portions 127 in the semiconductor substrate will be called an active region. The semiconductor region 5 of a conductivity type which serves as a potential barrier against signal charges is formed adjacent to a side and lower portions of the element isolation portion 127 in the semiconductor substrate SB. For example, when the charge accumulation region 103 of the photoelectric conversion unit 27 is formed as an n-type semiconductor region to accumulate negative charges of electrons as signal charges, the conductivity type of the semiconductor region 5 is the p-type.

The lines 131 and 133 are arranged above the semiconductor substrate SB. The lines 131 and 133 function as a wiring line for supplying a signal from the vertical scanning circuit VSR to each pixel P, and a wiring line (e.g., the column signal line SL) for transmitting a signal output from each pixel P. The lines 131 and 133 are formed of a metal. For descriptive convenience, lines of the third and subsequent layers are not illustrated in FIG. 2.

The interlayer films 130, 132, and 134 are arranged above the semiconductor substrate SB. The interlayer films 130, 132, and 134 are arranged to insulate the lines 131 and 133 from another layer. Each of the interlayer films 130, 132, and 134 is formed of an insulator such as silicon oxide.

The color filters 20 are arranged above the semiconductor substrate SB, the lines 131 and 133, and the interlayer films 130, 132, and 134. The color filters 20 are arranged above the respective photoelectric conversion units 27. The color filter 20 has a spectral transmittance peak at a predetermined wavelength (see Table 1 to be described later).

A silicon oxynitride film, silicon nitride film, inner-layer lens, planarized layer, and the like may also be arranged between the interlayer film 134 and the color filter 20.

The first antireflection portion 106 has a multilayered structure including a first insulation film 107 and second insulation film 108. The first insulation film 107 is arranged on the semiconductor substrate SB. The second insulation film 108 is arranged on the semiconductor substrate SB. The first antireflection portion 106 reduces reflection of light (e.g., incident light IR1) entering the photoelectric conversion units 27 in the photoelectric conversion units 27. The first insulation film 107 is formed on a plurality of photoelectric conversion units 27, and may also serve as, e.g., the gate insulation film of a transistor. The second insulation film 108 is formed on the first insulation film 107. The first insulation film 107 has a first refractive index n1, and the second insulation film 108 has a second refractive index n2. The second refractive index n2 takes a value between the refractive index of the interlayer film 130 and that of the photoelectric conversion unit 27. The second refractive index n2 is higher than the first refractive index n1, and takes a value between the first refractive index n1 and the refractive index of the photoelectric conversion unit 27. The second insulation film 108 has a first thickness d1. The first thickness d1 takes a value enough to reduce, in the photoelectric conversion unit 27, reflection of light having passed through the color filter 20 and entering the photoelectric conversion unit 27.

The first antireflection portion 106 reduces the reflectance in the photoelectric conversion unit 27. More specifically, reflection of light entering the photoelectric conversion unit 27 is reduced in the photoelectric conversion unit 27 by appropriately setting the thickness of the second insulation film 108 because of the following reason. When the first insulation film 107 also serves as the gate insulation film of a transistor (e.g., the transfer gate 9, reset transistor 25, or amplification transistor 29 shown in FIG. 1), the thickness of the first insulation film 107 is set in accordance with electrical characteristics needed for the performance of the transistor. To the contrary, the thickness of the second insulation film 108 has high degree of freedom of design. The reflectance in the photoelectric conversion unit 27 represents the ratio of light finally reflected to the interlayer film 130 to light having passed through the interlayer film 130 and entering the photoelectric conversion unit 27. In the first antireflection portion 106, the first insulation film 107 is formed of, e.g., silicon oxide, and the second insulation film 108 is formed of, e.g., silicon nitride.

The second antireflection portion 126 has a multilayered structure including an element isolation portion 127 and third insulation film 128. The element isolation portion 127 is arranged in the semiconductor substrate SB. The third insulation film 128 is arranged on the semiconductor substrate SB. The second antireflection portion 126 reduces reflection of light (e.g., incident light IR2) entering the element isolation portion 127 in the element isolation portion 127. As a result, light can enter a semiconductor region (region adjacent to the element isolation portion 127 in the semiconductor substrate: e.g., the semiconductor region 5) around the element isolation portion 127. The third insulation film 128 is formed on the element isolation portion 127. The element isolation portion 127 includes an insulator having a first refractive index n1, and the third insulation film 128 has a second refractive index n2. The second refractive index n2 takes a value between the refractive index of the interlayer film 130 and that of the semiconductor region 5. The second refractive index n2 takes a value between the first refractive index n1 and the refractive index of the semiconductor region 5. The third insulation film 128 has a second thickness d2. The second thickness d2 is larger than the first thickness d1. The second thickness d2 takes a value enough to reduce, in the element isolation portion 127, reflection of light having passed through the color filter 20 and entering the element isolation portion 127. In this case, the refractive index of the insulator of the element isolation portion 127 is set to the first refractive index n1, but may also be set to a third refractive index n3 different from the first refractive index n1. The refractive index can be appropriately set in forming the element isolation portion 127, so the element isolation portion 127 can be easily formed of a material having a refractive index different from the first refractive index n1.

The second antireflection portion 126 reduces the reflectance in the element isolation portion 127. More specifically, reflection of light entering the element isolation portion 127 in the element isolation portion 127 is reduced by appropriately setting the thickness of the third insulation film 128. This is because the thickness of the element isolation portion 127 is set in accordance with electrical characteristics needed for the element isolation properties of the element isolation portion 127, whereas the thickness of the third insulation film 128 has a high degree of freedom of design. The reflectance in the element isolation portion 127 represents the ratio of light finally reflected to the interlayer film 130 to light having passed through the interlayer film 130 and entering the element isolation portion 127. In the second antireflection portion 126, the insulator of the element isolation portion 127 is formed of, e.g., silicon oxide, and the third insulation film 128 is formed of, e.g., silicon nitride.

The semiconductor region 5 is arranged in the semiconductor substrate SB. The semiconductor region 5 is arranged to cover the lower part of the element isolation portion 127. The semiconductor region 5 contains an impurity of the same conductivity type as that of a well region 104 at a concentration higher than that of the well region 104. When the charge accumulation region 103 of the photoelectric conversion unit 27 is formed as an n-type semiconductor region to accumulate negative charges of electrons as signal charges, the conductivity type of the well region 104 and semiconductor region 5 is the p-type. The semiconductor region 5 has a function of forming a potential barrier against charges to reduce leakage of charges accumulated in the photoelectric conversion unit 27 to the photoelectric conversion unit 27 of an adjacent pixel P.

The semiconductor region 5 may also have a function of reducing a leakage current from the defect of the element isolation portion 127. The semiconductor region 5 may also have both the function of reducing leakage of charges to an adjacent pixel and the function of reducing a leakage current.

Other semiconductor regions 110 and 111 containing an impurity of the same conductivity type as that of the well region 104 at a concentration higher than that of the well region 104 may be further formed. The semiconductor regions 110 and 111 have a function of forming a potential barrier against charges to reduce leakage of charges to an adjacent photoelectric conversion unit 27.

The planarized layer 21 is arranged above the semiconductor substrate SB. The planarized layer 21 is formed to cover the color filters 20, and its upper surface is planarized by CMP or the like. The planarized layer 21 is formed of, e.g., a resin similar to a resist.

The microlens 22 is arranged above the semiconductor substrate SB. The microlens 22 guides incident light (e.g., incident light IR1 and incident light IR2) to the interval between the lines 131. Part (e.g., the incident light IR1) of the light guided to the interval between the lines 131 is guided to the photoelectric conversion unit 27. The remaining part (e.g., the incident light IR2) diffracts and is guided to the element isolation portion 127.

As an area $A_1$ (see FIG. 3) occupied by the unit pixel P decreases, both a size L2 of the photoelectric conversion unit 27 and a size L1 of the element isolation portion 127 decrease. The size L1 of the element isolation portion 127 is restricted by a power supply voltage used in the photoelectric conversion device 200. It is more difficult to decrease the size L1 of the element isolation portion 127 than to decrease the size L2 of the photoelectric conversion unit 27. When decreasing the area $A_1$ occupied by the unit pixel P, the shrinkage factor of the size L2 of the photoelectric conversion unit 27 becomes higher than that of the size L1 of the element isolation portion 127. As the area $A_1$ occupied by the unit pixel P decreases, an absolute area $A_2$ of the photoelectric conversion unit 27 decreases, and a relative area ($A_2/A_1$) occupied by the photoelectric conversion unit 27 in the unit pixel P may also decrease.

As the area occupied by the unit pixel P decreases, the (absolute and relative) area of the photoelectric conversion unit 27 decreases, and an interval DP (see FIG. 2) between adjacent photoelectric conversion units 27 sometimes decreases. In this case, an interval DL between the lines 131 arranged vertically between the photoelectric conversion units 27 and the color filters 20 may also decrease. The result of a simulation performed by the present inventor reveals that as the interval DL between the lines 131 decreases, the ratio of light entering not the photoelectric conversion unit 27 but the element isolation portion 127 upon diffraction to light having passed through the interval between the lines 131 increases.

A case where the area occupied by the unit pixel decreases and neither the reflectance of light entering the photoelectric conversion unit 27 in the photoelectric conversion unit 27 nor the reflectance of light entering the element isolation portion 127 in the element isolation portion 127 is reduced will be examined. In this case, the area of the photoelectric conversion unit 27 decreases, and the ratio of light entering the photoelectric conversion unit 27 to light having passed through the color filter 20 also decreases. As a result, the sensitivity of the photoelectric conversion unit 27 may decrease. In most cases, light entering the element isolation portion 127 is reflected by a side face 127c or bottom face 127b of the element isolation portion 127, and exits upward from an upper face 127a of the element isolation portion 127. Light reflected by the element isolation portion 127 may enter a distant pixel while reflected by a wiring line and the like.

On the contrary, according to the embodiment, the first antireflection portion 106 reduces reflection of light (e.g., incident light IR1) entering a plurality of photoelectric conversion units 27 in the photoelectric conversion units 27. More specifically, light guided to the photoelectric conversion unit 27 upon diffraction out of light guided to the interval between the lines 131 practically passes through the first antireflection portion 106 and is guided to the photoelectric conversion unit 27. The second antireflection portion 126 reduces reflection of light (e.g., incident light IR2) entering the element isolation portion 127 in the element isolation portion 127. More specifically, light guided to the element isolation portion 127 upon diffraction out of light guided to the interval between the lines 131 practically passes through the second antireflection portion 126, and at least part of the light is photoelectrically converted into charges by the photoelectric conversion unit 27. The converted charges are guided to the charge accumulation region 103 of the photoelectric conversion unit 27 as charges used as a signal. Hence, the photoelectric conversion unit 27 can capture not only charges corresponding to light (e.g., incident light IR1) entering the photoelectric conversion unit 27 itself, but also charges corresponding to light (e.g., incident light IR2) entering the element isolation portion 127. This can suppress a decrease in the sensitivity of the photoelectric conversion unit 27 even when the ratio of light entering not the photoelectric conversion unit 27 but the element isolation portion 127 increases upon decreasing an area occupied by the unit pixel P. The semiconductor region 5 can also be arranged to easily capture charges corresponding to light entering the element isolation portion 127.

The second antireflection portion 126 will be explained in detail.

Light (e.g., incident light IR1 and incident light IR2) entering the photoelectric conversion device 200 having the above-described structure reaches, at a given probability, the element isolation region 102 adjacent to the light receiving region 101. In the light receiving region 101, the photoelectric conversion unit 27 is arranged. In the element isolation region 102, the element isolation portion 127 is arranged. The incident light IR2 which has reached the element isolation region 102 is reflected repetitively between the upper face 127a and bottom face 127b of the element isolation portion 127, and passes through the bottom face 127b at a predetermined probability. In other words, the second antireflection portion 126 reduces reflection of light in the element isolation region 102. At least part of light having passed through the bottom face 127b of the element isolation portion 127 is photoelectrically converted by the photoelectric conversion unit 27 and guided to the charge accumulation region 103 of the photoelectric conversion unit 27.

For example, the light intensity distribution of one pixel region (see region PR of FIG. 2) when light having a wavelength of 550 nm entered a structure in which the interval DL between the lines 131 was about 1 µm and the height of the line 131 from a surface 27a of the photoelectric conversion unit 27 was about 0.8 µm was obtained by calculation. The result reveals that about 10% of incident light reached the element isolation region 102 adjacent to the light receiving region 101. If all light which has reached the element isolation region 102 can be collected and guided to the photoelectric conversion unit 27, the sensitivity of the photoelectric conversion unit 27 can be improved by about 10%.

A method of determining the first thickness d1 and second thickness d2 shown in FIG. 2 will be explained. A case where the photoelectric conversion unit 27 and semiconductor region 5 are formed of silicon, the interlayer film 130, first insulation film 107, and element isolation portion 127 are formed of silicon oxide films, and the second insulation film 108 and third insulation film 128 are formed of silicon nitride films will be exemplified.

Figure 4:
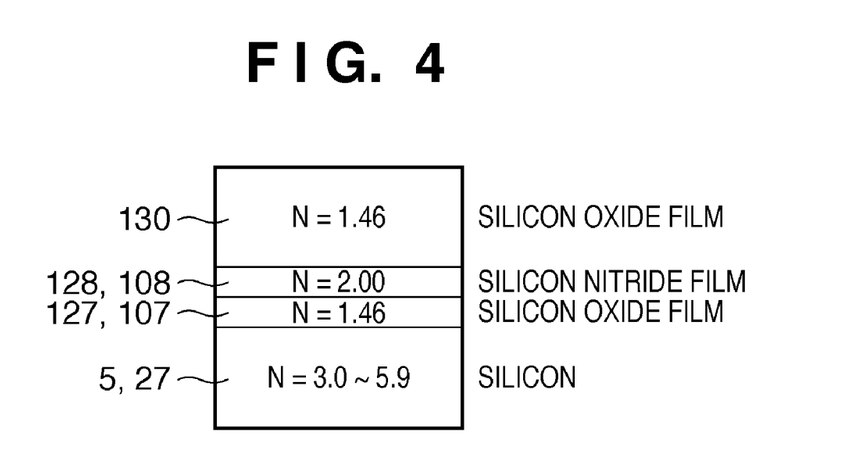
FIG. 4 is a view showing the refractive index of each portion.

A refractive index "2.00" of the second insulation film 108 (silicon nitride film) is a value between a refractive index "1.46" of the interlayer film 130 (silicon oxide) and a refractive index "3.0 to 5.9" of the photoelectric conversion unit 27 (silicon) (see FIG. 4). The second insulation film 108 (silicon nitride film) has the first thickness d1. The first thickness d1 takes a value enough to reduce reflection of light having passed through the color filter 20 in the photoelectric conversion unit 27.

For example, when the thickness of the first insulation film 107 is 7.5 nm and the wavelength of light passing through the color filter 20 is 550 nm, the thickness (the first thickness d1 shown in FIG. 2) of the second insulation film 108 is set to 50 nm (see the following Table 1). In this case, the reflectance in the photoelectric conversion unit 27 is 9% (not shown in Table 1).

Meanwhile, a refractive index "2.00" of the third insulation film 128 (silicon nitride film) is a value between the refractive index "1.46" of the interlayer film 130 (silicon oxide) and a refractive index "3.0 to 5.9" of the semiconductor region 5 (silicon) (see FIG. 4). The third insulation film 128 (silicon nitride film) has the second thickness d2. The second thickness d2 is larger than the first thickness d1. The second thickness d2 takes a value enough to reduce reflection of light having passed through the color filter 20 in the element isolation portion 127. The value of the second thickness d2 is determined so that the reflectance in the element isolation portion 127 in the element isolation region 102 becomes lower than that obtained when the thickness of the third insulation film 128 is set to the first thickness d1 similarly to the second insulation film 108.

For example, when the thickness of the element isolation portion 127 is 300 nm and the wavelength of light passing through the color filter 20 is 550 nm, the thickness of the third insulation film 128 is set to the first thickness d1 of 50 nm (see the following Table 1). In this case, the reflectance in the element isolation portion 127 is 63%. Further, the thickness (the second thickness d2 shown in FIG. 2) of the third insulation film 128 is set to 130 nm so that the reflectance of multiple reflection in the element isolation portion 127 becomes lower than 63% (see the following Table 1). In this case, the reflectance in the element isolation portion 127 in the element isolation region 102 is 15%.

Similarly, reflectances in the element isolation portion 127 in the element isolation region 102 when the thickness of the element isolation portion 127 was set to 300 nm and 100 nm and the wavelength of light passing through the color filter 20 was set to 500 nm, 550 nm, and 600 nm were obtained. Table 1 shows the results compared between a case where the thicknesses of the second insulation film 108 and third insulation film 128 are equal to each other and a case where they are different from each other (e.g. a case where the thicknesses of the third insulation film 128 is larger than the thicknesses of the second insulation film 108).

TABLE 1

| | | | | | | | | | | | | |
|---|---|---|---|---|---|---|---|---|---|---|---|---|
| Thickness of Element Isolation Portion [nm] | | 300 | | | | | | 100 | | | | |
| Thickness of Second Insulation Film [nm] | | 50 | | | 50 | | | 50 | | | 50 | |
| Thickness of Third Insulation Film [nm] | | 50 | | | 130 | | | 50 | | | 140 | |
| Wavelength of Light [nm] | 500 | 550 | 600 | 500 | 550 | 600 | 500 | 550 | 600 | 500 | 550 | 600 |
| Reflectance in Element Isolation Portion [%] | 53 | 63 | 50 | 34 | 15 | 28 | 65 | 61 | 53 | 33 | 15 | 18 |

As represented by Table 1, the reflectance in the element isolation portion 127 in the element isolation region 102 is reduced by setting the thickness (the second thickness d2 shown in FIG. 2) of the third insulation film 128 larger than the thickness (the first thickness d1 shown in FIG. 2) of the second insulation film 108.

It should be noted that the second thickness d2 may also be set smaller than the first thickness d1 as long as the reflectance in the element isolation portion 127 becomes lower than that obtained when the thickness of the third insulation film 128 is set to the first thickness d1 similarly to the second insulation film 108.

When the element isolation portion 127 has a thickness of 300 nm, it may also adopt, for example, an STI element isolation structure or a LOCOS (LOCal Oxidation of Silicon) element isolation structure. When the element isolation portion 127 has a thickness of 100 nm, it may also adopt, for example, a trapezoidal mesa isolation type element isolation structure or an element isolation structure in which an insulation film is stacked in a trench.

The reflectance has been examined on the premise that light passing through the color filter 20 has a wavelength of 500 nm, 550 nm, and 600 nm, as shown in Table. 1. However, the wavelength is not limited to this. When color filters corresponding to a plurality of colors are used, the reflectance may also be examined using the average value of the wavelengths of light beams passing through the color filters corresponding to the respective colors, or the wavelength of light passing through a color filter corresponding to an arbitrary color. The wavelength of light passing through a color filter may also be a wavelength at which the spectral transmittance of the color filter peaks.

Figure 5:
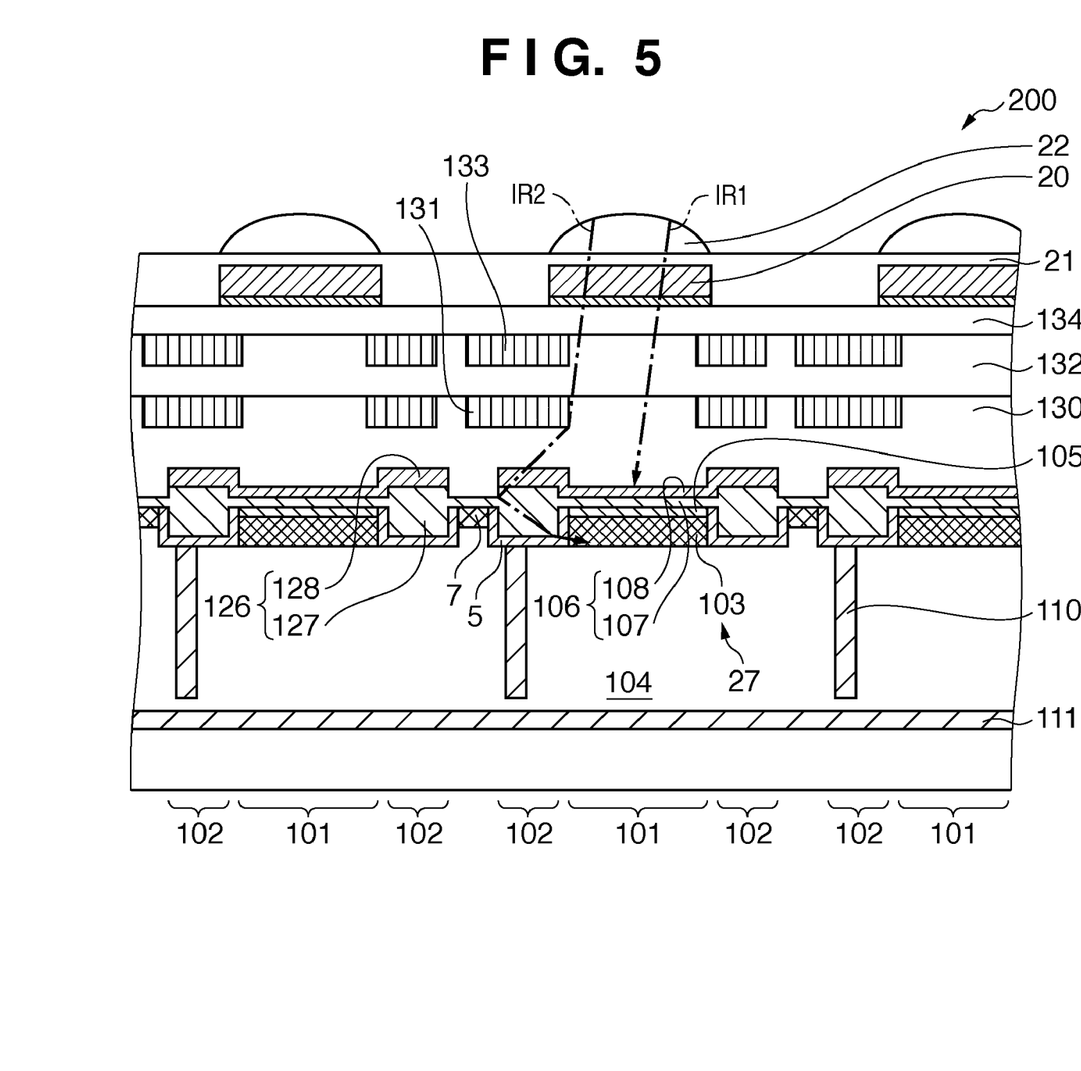
FIG. 5 is a sectional view showing the sectional structure of the photoelectric conversion device according to the embodiment of the present invention.

As shown in FIG. 5, the structure of a section taken along the line B-B' in a direction perpendicular to the section taken along the line A-A' in FIG. 3 is similar to the structure (see FIG. 2) of the section taken along the line A-A'. That is, the embodiment can be similarly applied to the section taken along the line B-B'. The second insulation film 108 included in the first antireflection portion 106, and the third insulation film 128 included in the second antireflection portion 126 may also be simultaneously formed by forming them entirely in the pixel array region 220, and may also be formed of a continuous film. However, a process to selectively etch or additionally form either the second insulation film 108 or third insulation film 128 is executed to make their thicknesses different from each other. As shown in FIG. 5, the continuous film may also be removed from the FD 7 (see FIG. 1). This facilitates forming a contact plug on the FD 7. The continuous film may be removed not only from a region on the FD 7 but also from a region where another contact is formed (e.g., a region on a source or drain region of a transistor). The continuous film can also be used as an etching stop film in forming a contact.

The second insulation film 108 and third insulation film 128 may also be formed of the same material (e.g., silicon nitride) or different materials as long as they have the similar refractive index (similar as the second refractive index n2).

The size L1 (see FIG. 3) of the third insulation film 128 may also be designed in consideration of the influence of diffraction. In a structure in which the interval DL between the lines 131 is about 1 μm and the height of the line 131 from the surface 27a of the photoelectric conversion unit 27 is 500 nm or less, a position where diffracted light enters can be regarded as a position spaced apart by 500 nm or less from the end of the surface 27a of the photoelectric conversion unit 27. The surface 27a is a closed surface.

Assume that the third insulation film 128 having the size L1 of 500 nm is arranged around the photoelectric conversion unit 27 of an almost square, one side of which is 1.6 μm long. In this case, the silicon nitride film is a square, one side of which is 2.6 μm long. This is because 0.5 μm×2 (two sides)+ 1.6 μm=2.6 μm. Hence, when the element isolation portion 127 has a thickness of 300 nm, an etching process is done to form the third insulation film 128 into a 2.6-μm square per photoelectric conversion unit 27 at a thickness of 130 nm. Further, an etching process is executed to etch the second insulation film 108 into a 1.6-μm square 50 nm thick on the photoelectric conversion unit 27. This etching process is performed by photolithography, so the photomask is designed in advance to perform the same etching process for all the photoelectric conversion units 27.

Since a plurality of photoelectric conversion units 27 are not arranged in the peripheral region 210 (see FIG. 1), no third insulation film 128 may also be formed.

Instead of the third insulation film 128, polysilicon or porous silicon whose refractive index is decreased from the value 5.5 of single-crystal silicon to less than 4.0 by adjusting film formation conditions and the density may also be formed on the element isolation portion 127. The polysilicon or porous silicon film needs to implement a high transmittance of 95% or more with respect to light having passed through the color filter 20. For this reason, the thickness of the polysilicon or porous silicon film is adjusted so that the reflectance in the element isolation portion 127 becomes lower than that obtained when the thickness of the third insulation film 128 is set to the first thickness d1 similarly to the second insulation film 108. For example, the film thickness is adjusted to set the reflectance in the element isolation portion 127 to less than 50% to 63% (see Table 1).

Figure 6:
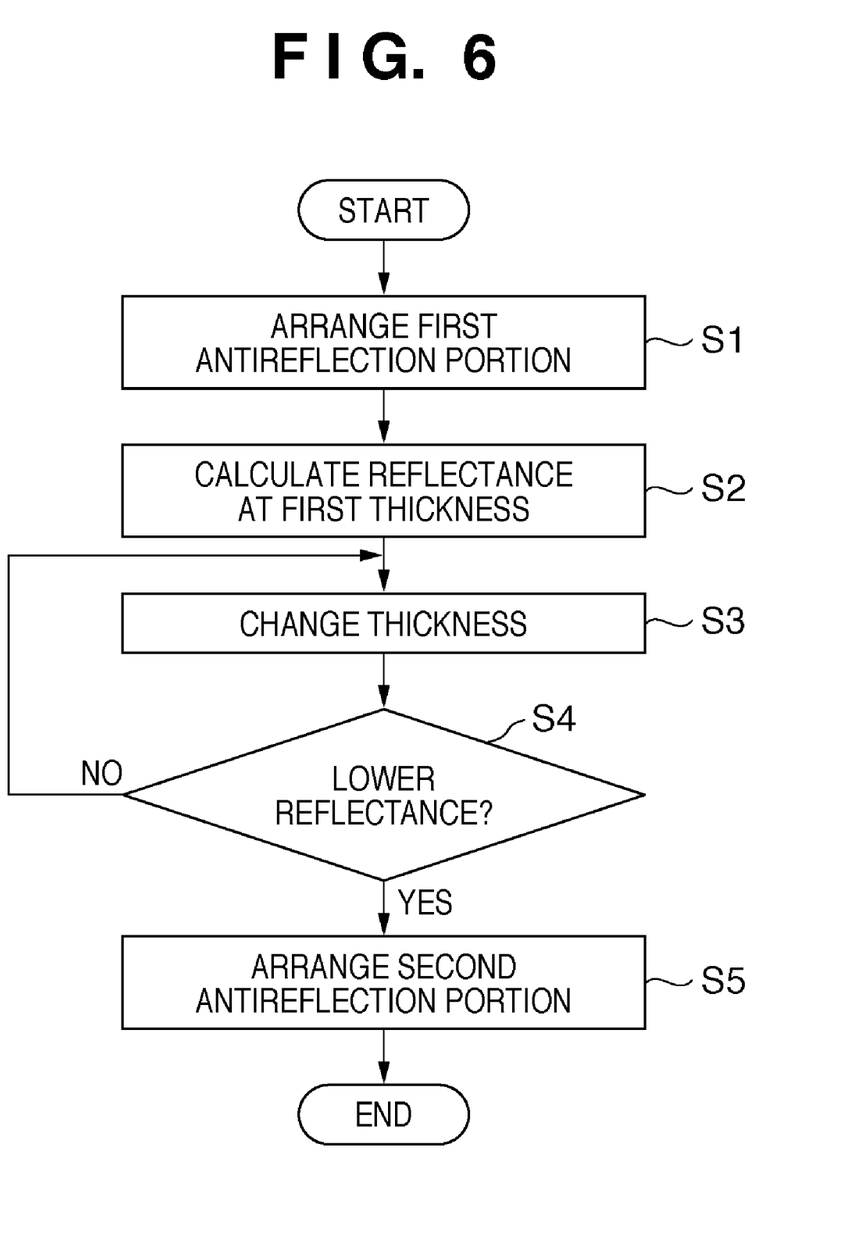
FIG. 6 is a flowchart showing a photoelectric conversion device designing method (manufacturing method) according to the embodiment of the present invention.

A method of designing (manufacturing) the photoelectric conversion device 200 according to the embodiment of the present invention will be explained with reference to FIG. 6. FIG. 6 is a flowchart showing the designing and manufacturing methods of the photoelectric conversion device 200 according to the embodiment of the present invention.

FIG. 6 shows a film thickness designing sequence when arranging the second and third insulation films in a photoelectric conversion device in which a plurality of photoelectric conversion units 27 covered with the first insulation film, other elements, element isolation portions are designed.

In step S1, process design data is input to the input unit (not shown) of a computer (not shown). The process design data is pattern data used for a process design program such as a process CAD. The process design data includes information (information of a photoelectric conversion device during design) in which the pixel array region 220 and peripheral region 210 are arranged and a plurality of photoelectric conversion units 27 are arranged in the pixel array region 220. The input unit accepts the first instruction to form the first and second insulation films. The input unit supplies the process design data and first instruction to a CPU (not shown). The CPU acquires the process design data (pattern data) via the input unit. The CPU changes the process design data as follows on the basis of the first instruction. More specifically, the CPU changes the process design data to form the first insulation film 107 having the first refractive index n1 on a plurality of photoelectric conversion units 27 (second step), and form the second insulation film 108 having the second refractive index n2 on the first insulation film 107 at the first thickness d1 (third step). The CPU changes the process design data to arrange the first antireflection portion 106 in the pixel array region 220.

In step S2, the input unit accepts the second instruction to provisionally form the element isolation portion 127, semiconductor region 5, and third insulation film 128. The input unit supplies the second instruction to the CPU. The CPU changes the process design data as follows on the basis of the second instruction. More specifically, the CPU changes the process design data to form the element isolation portion 127 having the first refractive index n1 at the third thickness d3 (first step), and form the third insulation film 128 having the second refractive index n2 on the element isolation portion 127 at the first thickness d1. Based on the second instruction, the CPU also changes the process design data to form the semiconductor region 5 adjacent to the element isolation portion 127 (fifth step). The input unit accepts the third instruction to form the line 131 and interlayer film 130. The input unit supplies the third instruction to the CPU. Based on the third instruction, the CPU changes the process design data to form the interlayer film 130 on the second insulation film 108 and third insulation film 128 (sixth step), and form the line 131 on the interlayer film 130. The CPU calculates a reflectance $R_1$ in the photoelectric conversion unit 27 and a reflectance $R_2$ in the element isolation portion 127 by using equations (1) to (4):

$$R_1 = (r_1 - r_0 \exp(-i\epsilon_1)) \div (1 - r_1 r_0 \exp(-i\epsilon_1)) \quad (1)$$

where $r_1$ and $r_0$ are reflectances on an upper face 107a and bottom face 107b of the first insulation film 107.

$$\epsilon_1 = 4\pi n 1 d 1 \cos \theta / \lambda \quad (2)$$

where $\theta$ is the incident angle of light, and $\lambda$ is the wavelength of light.

$$R_2 = (r_3 - r_2 \exp(-i\epsilon_2)) \div (1 - r_3 r_2 \exp(-i\epsilon_2)) \quad (3)$$

where $r_3$ and $r_2$ are reflectances on the upper face 127a and bottom face 127b of the element isolation portion 127.

$$\epsilon_2 = 4\pi n 1 d 1 \cos \theta / \lambda \quad (4)$$

where $\theta$ is the incident angle of light, and $\lambda$ is the wavelength of light.

In step S3, the CPU changes the thickness of the third insulation film 128 so that the reflectance in the element isolation portion 127 becomes lower than $R_2$. The CPU changes the thickness of the third insulation film 128 to, e.g., the second thickness d2.

In step S4, the CPU calculates the reflectance in the element isolation portion 127 for the third insulation film 128 having the thickness d2 after the change. More specifically, the CPU calculates a reflectance $R_{21}$ instead of $R_2$ by replacing d1 with d2 in equations (3) and (4). The CPU determines whether the newly calculated reflectance $R_{21}$ is lower than the reflectance $R_2$ calculated in step S2. If the CPU determines that the reflectance $R_{21}$ is lower than the reflectance $R_2$, the process advances to step S5. If the CPU determines that the reflectance $R_{21}$ is equal to or higher than the reflectance $R_2$, the process returns to step S3.

The CPU may also display the reflectances $R_{21}$ and $R_2$ on the screen, and accept, via the input unit from a user (designer) who views the screen, information representing whether the reflectance $R_{21}$ is lower than the reflectance $R_2$. In this case, the user directly determines whether the reflectance $R_{21}$ is lower than the reflectance $R_2$. Based on the accepted information representing whether the reflectance $R_{21}$ is lower than the reflectance $R_2$, the CPU can determine whether the reflectance $R_{21}$ is lower than the reflectance $R_2$.

By repeating the loop of steps S3 and S4, the CPU determines the second thickness d2. As a result, the second thickness d2 is set to a value at which the reflectance in the element isolation portion 127 becomes lower than that obtained when the thickness of the third insulation film 128 is set to the first thickness d1 similarly to the second insulation film 108.

In step S5, the CPU changes the process design data to form the third insulation film 128 at the second thickness d2 on the element isolation portion 127 (fourth step).

The above-described equations (1) to (4) are formulated by referring to 'H. Kubota, "Applied Optics", pp. 95-97, Iwanami, Tokyo, 1959':

$$R_x = (r_x - R[x-1] \exp(-i\epsilon_x)) / (1 - r_x R[x-1] \exp(-i\epsilon_x))$$

$$\epsilon_x = 4\pi n x \times d x \times \cos \theta / \lambda$$

where $r_x$ is the reflectance of the upper face of an x layer, nx is the refractive index of the x layer, dx is the thickness of the x layer, $\theta$ is the incident angle of light, $\lambda$ is the wavelength of light, and $R[x-1]$ is a complex type reflectance below the x layer.

Figure 7:
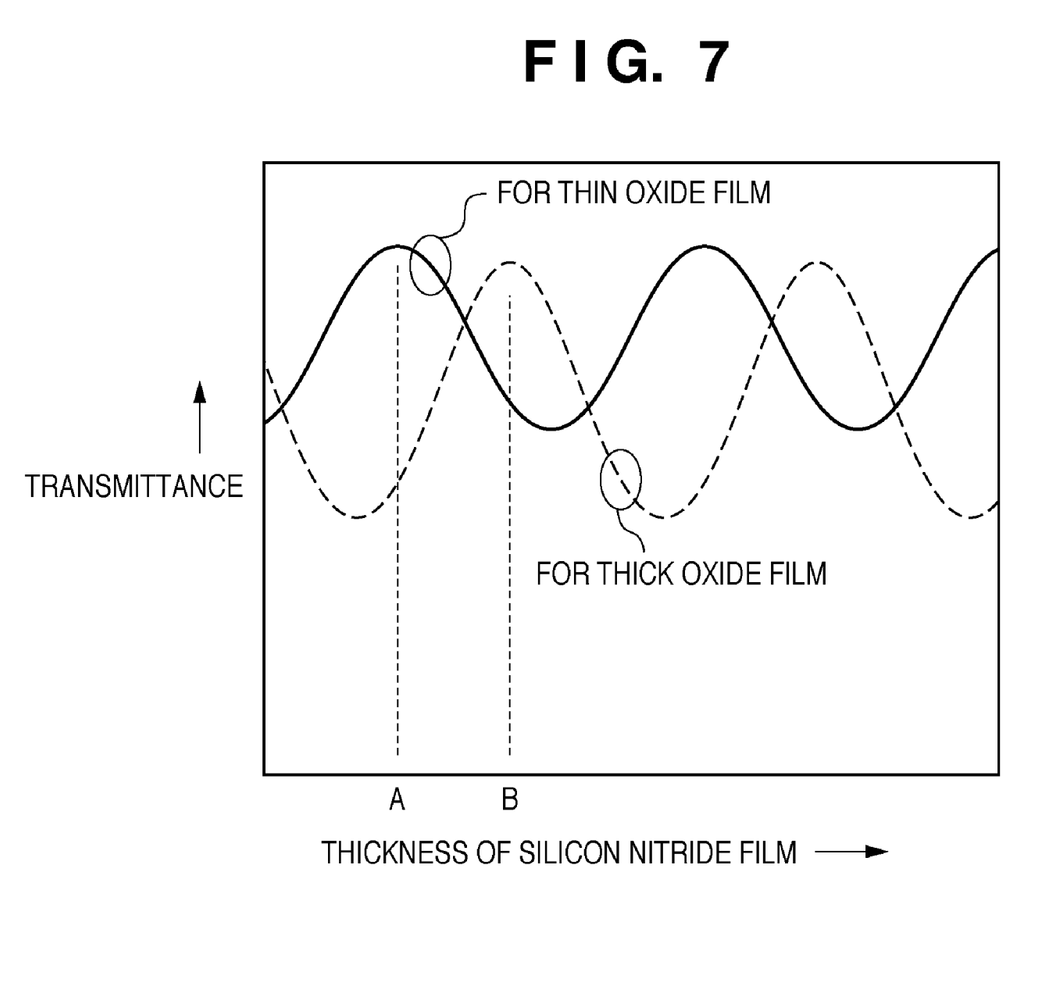
FIG. 7 is a graph showing the relationship between the thickness of a silicon nitride film and its transmittance.

The reflectances $R_1$ and $R_2$ calculated by equations (1) to (4) can be expressed discretely as shown in Table 1 or continuously as shown in FIG. 7. FIG. 7 is a graph showing the relationship between the thickness of a silicon nitride film and its transmittance. In FIG. 7, the abscissa axis represents the thickness of the silicon nitride film, and the ordinate axis represents the transmittance (=100%−reflectance).

In FIG. 7, a thick curve corresponds to a case where the element isolation portion is relatively thin, and a broken curve corresponds to a case where the element isolation portion is relatively thick. As is apparent from FIG. 7, the transmittance, i.e., reflectance changes periodically in accordance with the thickness. In FIG. 7, an achievable value is selected from thicknesses corresponding to high transmittances. In general, the thickness is set to a value of 10 nm to 200 nm in consideration of the distance to the first wiring layer (i.e. the lowermost wiring layer). In the embodiment, thicknesses selected from Table 1 are conceptually minimum ones corresponding to A and B in FIG. 7.

Figure 8:
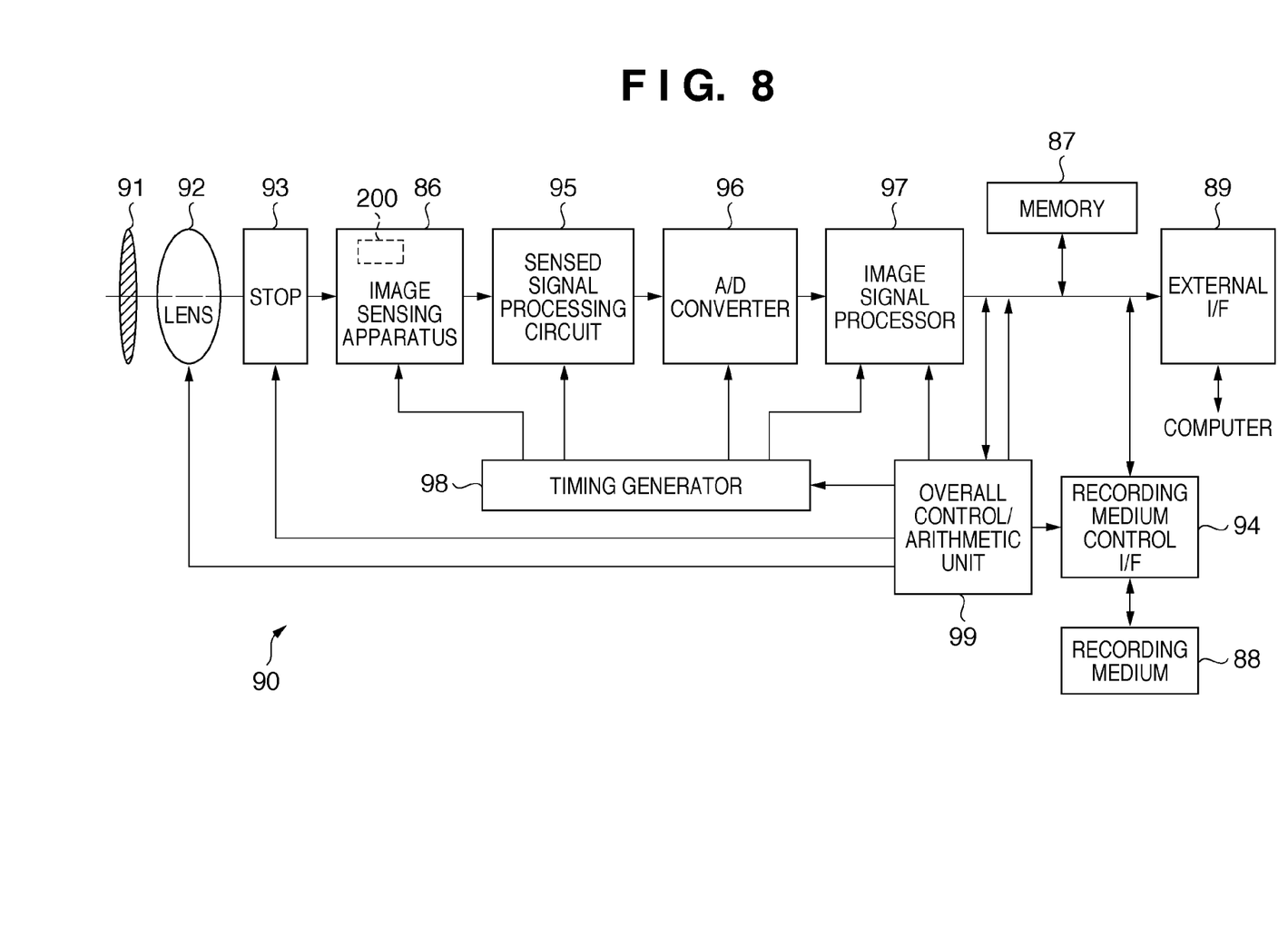
FIG. 8 is a block diagram showing the configuration of an imaging system to which the photoelectric conversion device according to the embodiment of the present invention is applied.

FIG. 8 shows an example of an imaging system to which the photoelectric conversion device according to the present invention is applied.

As shown in FIG. 8, an imaging system 90 mainly includes an optical system, image sensing apparatus 86, and signal processing unit. The optical system mainly includes a shutter 91, lens 92, and stop 93. The image sensing apparatus 86 includes the photoelectric conversion device 200. The signal processing unit mainly includes a sensed signal processing circuit 95, A/D converter 96, image signal processor 97, memory 87, external I/F 89, timing generator 98, overall control/arithmetic unit 99, recording medium 88, and recording medium control I/F 94. The signal processing unit may not include the recording medium 88.

The shutter 91 is arranged in front of the lens 92 on the optical path to control the exposure.

The lens 92 refracts incident light to form an object image in the photoelectric conversion region of the photoelectric conversion device 200 of the image sensing apparatus 86.

The stop 93 is interposed between the lens 92 and the photoelectric conversion device 200 on the optical path. The stop 93 adjusts the quantity of light guided to the photoelectric conversion device 200 after passing through the lens 92.

The photoelectric conversion device 200 of the image sensing apparatus 86 converts an object image formed on the image sensing surface (pixel array) of the pixel array region 220 into an image signal. The photoelectric conversion device 200 of the image sensing apparatus 86 reads out the image signal from the pixel array, and outputs it.

The sensed signal processing circuit 95 is connected to the image sensing apparatus 86, and processes an image signal output from the image sensing apparatus 86.

The A/D converter 96 is connected to the sensed signal processing circuit 95. The A/D converter 96 converts a processed image signal (analog signal) output from the sensed signal processing circuit 95 into an image signal (digital signal).

The image signal processor 97 is connected to the A/D converter 96. The image signal processor 97 performs various arithmetic processes such as correction for an image signal (digital signal) output from the A/D converter 96, generating image data. The image signal processor 97 supplies the image data to the memory 87, external I/F 89, overall control/arithmetic unit 99, recording medium control I/F 94, and the like.

The memory 87 is connected to the image signal processor 97, and stores image data output from the image signal processor 97.

The external I/F 89 is connected to the image signal processor 97. Image data output from the image signal processor 97 is transferred to an external device (e.g., a personal computer) via the external I/F 89.

The timing generator 98 is connected to the image sensing apparatus 86, sensed signal processing circuit 95, A/D converter 96, and image signal processor 97. The timing generator 98 supplies timing signals to the image sensing apparatus 86, sensed signal processing circuit 95, A/D converter 96, and image signal processor 97. The image sensing apparatus 86, sensed signal processing circuit 95, A/D converter 96, and image signal processor 97 operate in synchronism with the timing signals.

The overall control/arithmetic unit 99 is connected to the timing generator 98, image signal processor 97, and recording medium control I/F 94, and controls all of them.

The recording medium 88 is detachably connected to the recording medium control I/F 94. Image data output from the image signal processor 97 is recorded on the recording medium 88 via the recording medium control I/F 94.

With this arrangement, the photoelectric conversion device 200 can provide a high-quality image (image data) as long as it can obtain a high-quality image signal.

In the above-described embodiment, the well region 104 is of the p-type, but may also be of the n-type. In this case, the n-type well region 104 is doped more lightly than the charge accumulation region 103. The conductivity type of the well region 104 is opposite to that of the semiconductor regions 5, 110, and 111.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-098748, filed Apr. 4, 2008, which is hereby incorporated by reference herein in its entirety.

What is claimed is:

1. A photoelectric conversion device comprising:
a plurality of photoelectric conversion units which are arranged in a semiconductor substrate;
a first antireflection portion including a first insulation film which is arranged on the photoelectric conversion units and which has a first refractive index, and a second insulation film which is arranged on the first insulation film and which has a second refractive index; and
a second antireflection portion including an element isolation portion which is arranged in the semiconductor substrate and which electrically isolates the plurality of photoelectric conversion units and which includes an insulator having a third refractive index, and a third insulation film which is thicker than the second insulation film and which is arranged on the element isolation portion and which has the second refractive index,
wherein the first antireflection portion reduces reflection of light entering the photoelectric conversion units in the photoelectric conversion units, and
the second antireflection portion reduces reflection of light entering the element isolation portion in the element isolation portion.

2. The device according to claim 1, wherein
an interlayer film is arranged on the third insulation film,
a semiconductor region is arranged at a position adjacent to the element isolation portion in the semiconductor substrate, and
the second refractive index takes a value between a refractive index of the interlayer film and a refractive index of the photoelectric conversion units or the semiconductor region.

3. A photoelectric conversion device comprising:
a plurality of photoelectric conversion units which are arranged in a semiconductor substrate;
a first insulation film which is arranged on the photoelectric conversion units and which has a first refractive index;
a second insulation film which is arranged on the first insulation film and which has a second refractive index;
an element isolation portion which is arranged in the semiconductor substrate and which electrically isolates the plurality of photoelectric conversion units and which includes an insulator having a third refractive index; and
a third insulation film which is thicker than the second insulation film and which is arranged on the element isolation portion and which has the second refractive index,
wherein the second refractive index is higher than the first refractive index and higher than the third refractive index.

4. The device according to claim 3, wherein
an interlayer film is arranged on the third insulation film,
a semiconductor region is arranged at a position adjacent to the element isolation portion in the semiconductor substrate, and
the second refractive index takes a value between a refractive index of the interlayer film and a refractive index of the photoelectric conversion units or the semiconductor region.

5. The device according to claim 2, wherein
the first insulation film, an insulator of the element isolation portion, and the interlayer film are formed of silicon oxide, and
the second insulation film and the third insulation film are formed of silicon nitride.

6. The device according to claim 4, wherein
the first insulation film, an insulator of the element isolation portion, and the interlayer film are formed of silicon oxide, and
the second insulation film and the third insulation film are formed of silicon nitride.

7. The device according to claim 1, wherein the third refractive index is equal to the first refractive index.

8. The device according to claim 3, wherein the third refractive index is equal to the first refractive index.

9. The device according to claim 1, wherein
a color filter is arranged above one of the plurality of photoelectric conversion units, the second insulation film is thick enough to reduce reflection of light having passed through the color filter in the one of the plurality of photoelectric conversion units, and the third insulation film is thick enough to reduce reflection of light having passed through the color filter in the element isolation portion.

10. The device according to claim 3, wherein a color filter is arranged above one of the plurality of photoelectric conversion units, the second insulation film is thick enough to reduce reflection of light having passed through the color filter in the one of the plurality of photoelectric conversion units, and the third insulation film is thick enough to reduce reflection of light having passed through the color filter in the element isolation portion.

11. An imaging system comprising:

a photoelectric conversion device defined in claim 1;

an optical system which forms an image on an image sensing surface of the photoelectric conversion device; and a signal processing unit which processes a signal output from the photoelectric conversion device to generate image data.

12. An imaging system comprising:

a photoelectric conversion device defined in claim 3;

an optical system which forms an image on an image sensing surface of the photoelectric conversion device; and a signal processing unit which processes a signal output from the photoelectric conversion device to generate image data.

* * * * *